(12) United States Patent
Cascio et al.

(10) Patent No.: US 11,082,054 B1
(45) Date of Patent: Aug. 3, 2021

(54) APPARATUS AND METHOD FOR TIME-INTERLEAVED ANALOG-TO-DIGITAL CONVERSION

(71) Applicant: Intel Corporation, Santa Clara, CA (US)

(72) Inventors: Giacomo Cascio, Villach (AT); Christian Lindholm, Villach (AT); Albert Molina, Novelda (ES); Martin Clara, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/912,812

(22) Filed: Jun. 26, 2020

(51) Int. Cl.
*H03M 1/12* (2006.01)
*H03M 1/06* (2006.01)
*H03M 1/36* (2006.01)

(52) U.S. Cl.
CPC ......... *H03M 1/121* (2013.01); *H03M 1/0612* (2013.01); *H03M 1/0678* (2013.01); *H03M 1/1225* (2013.01); *H03M 1/36* (2013.01); *H03M 1/0614* (2013.01); *H03M 1/0631* (2013.01); *H03M 1/12* (2013.01); *H03M 1/1215* (2013.01); *H03M 1/1245* (2013.01)

(58) Field of Classification Search
CPC .... H03M 1/12; H03M 1/1215; H03M 1/1245; H03M 1/0631; H03M 1/0614
See application file for complete search history.

(56) References Cited

U.S. PATENT DOCUMENTS 5,455,783 A * 10/1995 Yukawa ............. H03H 17/0664
708/313
9,143,149 B1 9/2015 van Engelen et al.
(Continued)

FOREIGN PATENT DOCUMENTS

EP 3091665 A1 11/2016

*Primary Examiner* — Joseph J Lauture
(74) *Attorney, Agent, or Firm* — 2SPL Patent Attorneys PartG mbB; Kieran O'Leary

(57) ABSTRACT

The present disclosure relates to a time-interleaved ADC circuit. The time-interleaved ADC circuit comprises an input for an analog input signal, a first ADC bank comprising a first plurality of parallel time-multiplexed ADCs, wherein the first plurality of parallel time-multiplexed ADCs is configured to subsequently generate a first plurality of samples of the analog input signal during a first time interval, a first buffer amplifier coupled between the input and the first ADC bank. The time-interleaved ADC circuit further comprises a second ADC bank comprising a second plurality of parallel time-multiplexed ADCs, wherein the second plurality of parallel time-multiplexed ADCs is configured to subsequently generate a second plurality of samples of the analog input signal during a second time interval, wherein the first and the second time intervals are subsequent time intervals, a second buffer amplifier coupled between the input and the second ADC bank. The first ADC bank has associated therewith a first dummy sampler, wherein the ADC circuit is configured to activate the first dummy sampler before the start of the first time interval. The second ADC bank has associated therewith a second dummy sampler, wherein the ADC circuit is configured to activate the second dummy sampler before the start of the second time interval.

18 Claims, 10 Drawing Sheets

(56) References Cited

U.S. PATENT DOCUMENTS 9,503,115 B1 * 11/2016 Shin ................... H03M 1/1215
9,602,116 B1     3/2017 Le et al.
9,847,839 B2 * 12/2017 Gopalakrishnan .... H04L 7/0331

* cited by examiner

APPARATUS AND METHOD FOR TIME-INTERLEAVED ANALOG-TO-DIGITAL CONVERSION

FIELD

The present disclosure relates to methods and apparatuses for analog-to-digital conversion and, more particularly, to methods and apparatuses for time-interleaved analog-to-digital conversion.

BACKGROUND

High-speed analog-to-digital converters (ADCs) with sampling speeds achieving several GS/s to beyond 10GS/s have become essential components in modern communication systems. The behavior of received signals in all modern transmission channel systems, especially when a data link is pushed toward its physical limits, are a complex mix of wanted and unwanted analog waveforms that have to be disentangled by ever more complex equalization (and channel selection) schemes.

A digitally equalized RF (RF=radio frequency) receiver channel uses the digital signal domain to implement some of the required equalization blocks, which necessitates the use of an ADC for analog-to-digital conversion. The specifications for such an ADC typically require a time-interleaved ADC. Time interleaving is a technique that allows the use of multiple identical analog-to-digital converters (ADCs) to process regular sample data series at a faster rate than the operating sample rate of each individual data converter. In simple terms, time interleaving comprises time multiplexing a parallel array of a plurality of N identical ADCs to achieve a higher net sample rate $f_s$ (with sampling period $T_s=1/f_s$) even though each ADC in the array is actually sampling (and converting) at the lower rate of $f_s/N$.

Time-interleaved ADCs may suffer from time-varying errors that may significantly degrade performance. Of the main errors in time-interleaved ADCs, timing skew may be the most prominent as its effect increases with input signal frequency. With high input signal bandwidths in current and future communication systems, the resulting sub-picosecond constraint on timing skew may be extremely difficult to achieve due to all the various sources of timing errors in the clock and signal path. Mitigating the effect of timing skew is important such that the dynamic performance specifications of the time-interleaved ADC can be fulfilled.

When input signals with multi-GHz frequencies are sampled, since the effect of timing skew increases with input frequency, it may overshadow the effect of gain and offset mismatch. The timing resolution required for time interleaved ADC can be sub-picosecond, and in some applications may even be less than 300 fs. As input signal frequencies increase, the constraint on timing skew grows more stringent and currently poses a final barrier on the ADC dynamic performance.

For example, in a multi-GS/s ADC, there is a demand for mitigation techniques of timing skew if performance limits are to be pushed any further.

BRIEF DESCRIPTION OF THE FIGURES

Some examples of apparatuses and/or methods will be described in the following by way of example only, and with reference to the accompanying figures, in which.

DETAILED DESCRIPTION

Figure 1:
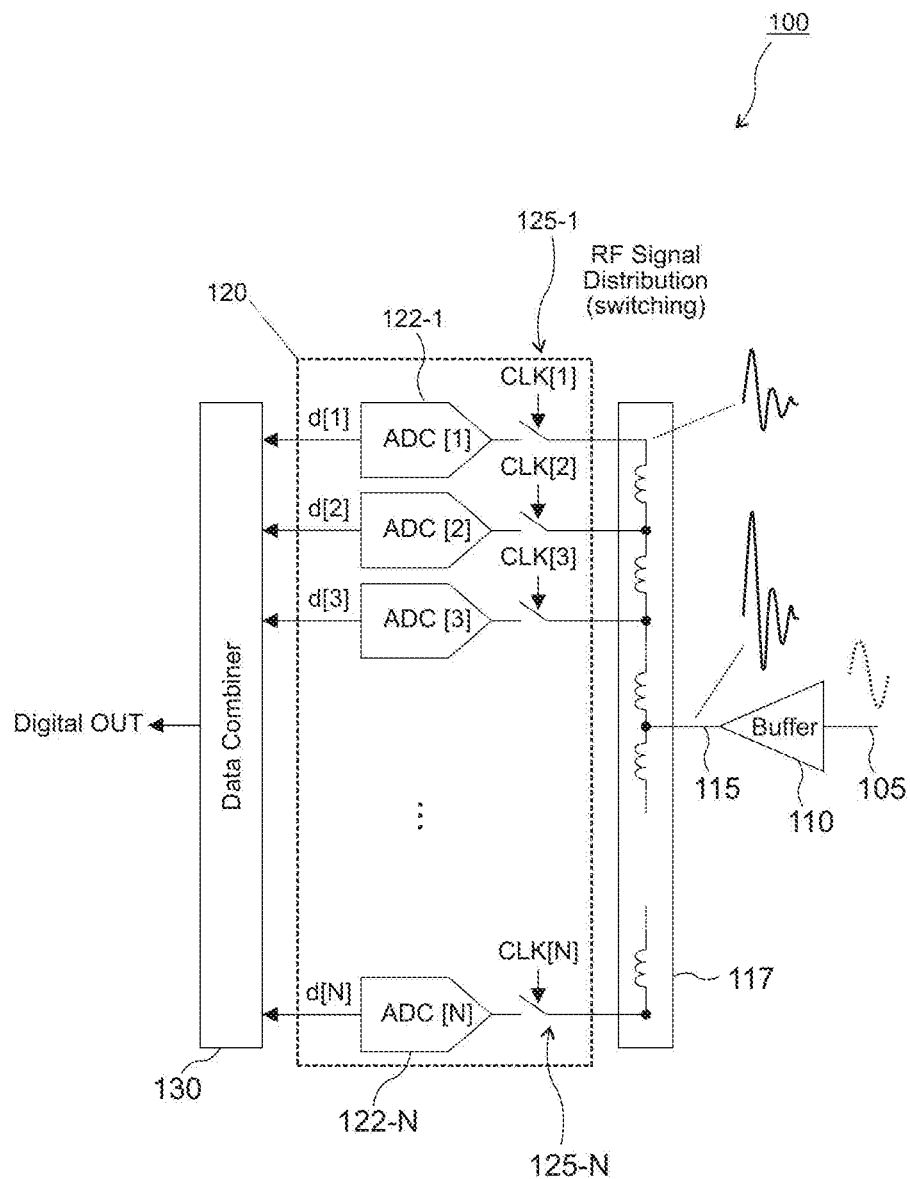
FIG. 1 shows a single-array time-interleaved ADC

Some examples are now described in more detail with reference to the enclosed figures. However, other possible examples are not limited to the features of these embodiments described in detail. Other examples may include modifications of the features as well as equivalents and alternatives to the features. Furthermore, the terminology used herein to describe certain examples should not be restrictive of further possible examples.

Throughout the description of the figures same or similar reference numerals refer to same or similar elements and/or features, which may be identical or implemented in a modified form while providing the same or a similar function. The thickness of lines, layers and/or areas in the figures may also be exaggerated for clarification.

When two elements A and B are combined using an 'or', this is to be understood as disclosing all possible combinations, i.e. only A, only B as well as A and B, unless expressly defined otherwise in the individual case. As an alternative wording for the same combinations, "at least one of A and B" or "A and/or B" may be used. This applies equivalently to combinations of more than two elements.

If a singular form, such as "a", "an" and "the" is used and the use of only a single element is not defined as mandatory either explicitly or implicitly, further examples may also use several elements to implement the same function. If a function is described below as implemented using multiple elements, further examples may implement the same function using a single element or a single processing entity. It is further understood that the terms "include", "including", "comprise" and/or "comprising", when used, describe the presence of the specified features, integers, steps, operations, processes, elements, components and/or a group thereof, but do not exclude the presence or addition of one or more other features, integers, steps, operations, processes, elements, components and/or a group thereof.

Several modern and innovative enhancement techniques are employed to design and realize high-performance ADCs in modern Complementary Metal-Oxide-Semiconductor (CMOS) technology, specifically using concepts of time-interleaving and mismatch calibration schemes to achieve energy efficient conversion at sample rates of multi-GSamples/second, trying to mitigate the impact of timing or clock skew.

A possible solution to significantly reduce timing skew in time-interleaved ADCs may be the use of "strong" RF input buffers to drive sub-ADCs with high linearity, wide bandwidth and unlimited slew-rate performance, investing bias currents typically in stark contrast with assigned product power budget. Here, the expression sub-ADC refers to an individual ADC of a parallel array of a plurality of essentially identical ADCs forming the time-interleaved ADC. A "strong" RF input buffer refers to a buffer amplifier able to deliver a lot of current at its output. An example of the buffer amplifier would be a voltage buffer.

It would also be possible to make a time-interleaved ADC less sensitive to the effect of timing skew by using a single track-and-hold (T/H) circuit in front of all the sub-ADCs. A T/H circuit is an analog device that tracks the voltage of a continuously varying analog signal and holds its value at a constant level for a specified minimum period of time. T/H circuits are typically used in ADCs to eliminate variations in input signal that can corrupt the A/D conversion process. A drawback of this solution is again a substantial power penalty and noise increase, especially if the front-end T/H-circuit is implemented in the core (bulk CMOS) technology on the same silicon die. Off-chip T/H-circuits in a process technology that, at least within a given limited power budget, is more suited to precision analog circuit design at GHz frequencies than core CMOS (e.g. silicon bipolar) are possible, but a multi-chip architecture generally leads to increased system complexity and cost.

Main disadvantage of using a single T/H-circuit in front of all the sub-ADCs is the limited bandwidth achievable in bulk CMOS technology, which is generally not suitable to fulfill RF performance requirements of most high-resolution multi-GS/s ADCs. If the T/H is implemented on a dedicated chip in a more power efficient (but generally more expensive) technology for the required multi-GHz bandwidths (e.g. silicon bipolar or CMOS SOI), then not only the system complexity increases, but also the interface between the two chips (T/H-chip and A/D-converter chip) poses unique design challenges. Moreover, the problem of compensating timing-skew remains unsolved in case more than a single RF-Buffer is used to drive ADC-slices of different time-interleaved arrays.

Another approach to mitigating the effect of timing skew is to correct it and can be accomplished by using either foreground or background calibration. There are two main techniques for compensating the effects of timing skew, which can be extended to other time-varying errors: A first technique may operate in the digital domain by appending a digital processor to the outputs of the sub-ADCs such that the digital processor may correct the digital outputs with adaptive filters. The second technique for reducing the effects of timing skew may operate in the mixed-signal domain by using a digital backend to detect certain characteristics of the discrete-time output and to then adjust analog circuits in order to compensate for the effect of timing skew, with a power-efficient partitioning of tasks between the analog and digital domain.

Digital compensation techniques require the use of fractional delay filters. The nature of a fractional delay filter leads to a high complexity in the number of filter taps required, and the power consumption of the digital correction system is a limiting barrier when it comes to implementing such an architecture for multi-GS/s ADCs which suffer a large power penalty that currently makes this infeasible.

FIG. 1 shows a typical implementation of a time-interleaved ADC circuit 100.

Time-interleaved ADC circuit 100 comprises an input buffer amplifier 110. Input buffer amplifier 110 may provide electrical impedance transformation from signal input 105 to the output 115 of buffer amplifier 110 with the aim of preventing the input 105 from being affected by whatever currents (or voltages, for a current buffer) that a load at the buffer's output 115 may be produced with. The buffer amplifier's output 115 is coupled to a time-interleaved ADC array (also referred to as time-interleaved ADC bank) 120 via a signal distribution network 117. Time-interleaved ADC array 120 comprises N parallel sub-ADCs 122-1, . . . , 122-N. Each of the sub-ADCs 122-1, . . . , 122-N comprises a respective input-sampling circuit having a respective input switch 125-1, . . . , 125-N, a respective capacitor (not shown), and a respective digitizer (not shown) for digitizing a potential of the capacitor. The input of each sub-ADC 122-1, . . . , 122-N is coupled to the buffer amplifier's output 115 via signal distribution network 117 and the respective switches 125-1, . . . , 125-N. Each of the N switches 125-1, . . . , 125-N and hence each of the N sub-ADCs 122-1, . . . , 122-N is controlled by a clock with period $Ts=N \times Ts$. The ideal phase offset of the clock for the $i_{th}$ sub-ADC 122-$i$ with respect to the first sub-ADC 122-1 is $i \times Ts$, where $i=0, \ldots, N-1$.

In FIG. 1, an analog input 105 is subsequently sampled by the N sub-ADCs 122-1, . . . , 122-N which results in a combined digital output data series d[1], . . . , d[N]. Sub-ADC 122-1 may sample input 105 first at time $t_0$ and begin converting it into a k-bit digital representation d[1]. $T_s$ seconds later, sub-ADC 122-2 may sample RF input 105 at $(t_0+T_s)$ and begin converting it into ak-bit digital representation d[2]. Then, $T_s$ seconds later, sub-ADC 122-3 may sample input 105 at $(t_0+2T_s)$, and so on. After sub-ADC 122-N has sampled input signal 105 at $(t_0+(N-1)T_s)$, the next sampling cycle starts with sub-ADC 122-2 sampling input signal 105 at $(t_0+N \times T_s)$ and this carousel carries on.

As the k-bit outputs of the parallel sub-ADCs 122-1, . . . , 122-N become sequentially available in the same order as just described for the sampling operation, these digital k-bit words may be collected by a data combiner or demultiplexer 130. Here, the recombined data output sequence $D_{OUT}(t_0+L)$, $D_{OUT}(t_0+L+T_s)$, $D_{OUT}(t_0+L+2T_s)$, . . . may be obtained. L stands for a fixed conversion time of each individual sub-ADC 122-1, . . . , 122-N. This recombined data sequence is an k-bit data series with sample rate $f_s=1/T_s$. So, while the individual sub-ADC 122-1, . . . , 122-N, also often referred to as the "channels," are k-bit ADCs sampling at $f_s/N$, the time-interleaved ADC array 120 is equivalent to a single k-bit ADC sampling at $f_s$. Thus, time-interleaved ADC array 120 is an architecture that cycles through a set of N sub-ADCs, such that the aggregate throughput is N times the sample rate of the individual sub-ADCs.

Therefore, such an architecture enables the sample rate to be pushed further than that achievable with single channel ADCs. This may be beneficial for sampling at high frequencies. For example, a time-interleaved ADC may be used to directly convert RF signals from analog to digital domain. It can be demonstrated in an analytical way, in time and in frequency domain, that sub-ADC output consists of scaled input signal replicas and under ideal condition, without mismatch and time-varying errors, the resulting time-interleaved ADC output spectrum is identical to the input signal.

Unfortunately, in a real physical implementation each sub-ADC 122-1, . . . , 122-N has its own offset, gain and timing skew as well as the signal and clock distribution may have differences imposed by the distributed nature of this architecture which can result in time-varying errors degrading ADC performance.

The effect of offset mismatch between sub-ADCs 122-1, ..., 122-N consists of undesired tones spaced by $$\frac{k \cdot f_s}{N}$$

with k=1, ..., N−1. These tones are not a function of the input signal 105, and only depend on the size of the offsets and the number of sub-ADCs N.

The effect of gains mismatch may produce replicas in the sub-ADC outputs that do not necessarily cancel out. The magnitude of these residual replicas is a function of the sub-ADC gains, such that the gain errors effectively amplitude modulate the input signal.

Like gain mismatches, when the individual timing skews are not all identical, the replicas in the sub-ADC outputs do not cancel in the aggregate time-interleaved ADC output. The phases of these replicas are a function of the timing skews, effectively phase modulating the input signal. In addition to having non-zero replicas, the baseband signal is slightly distorted, which is a result of the frequency dependent phase shifts caused by timing skew.

Figure 2:
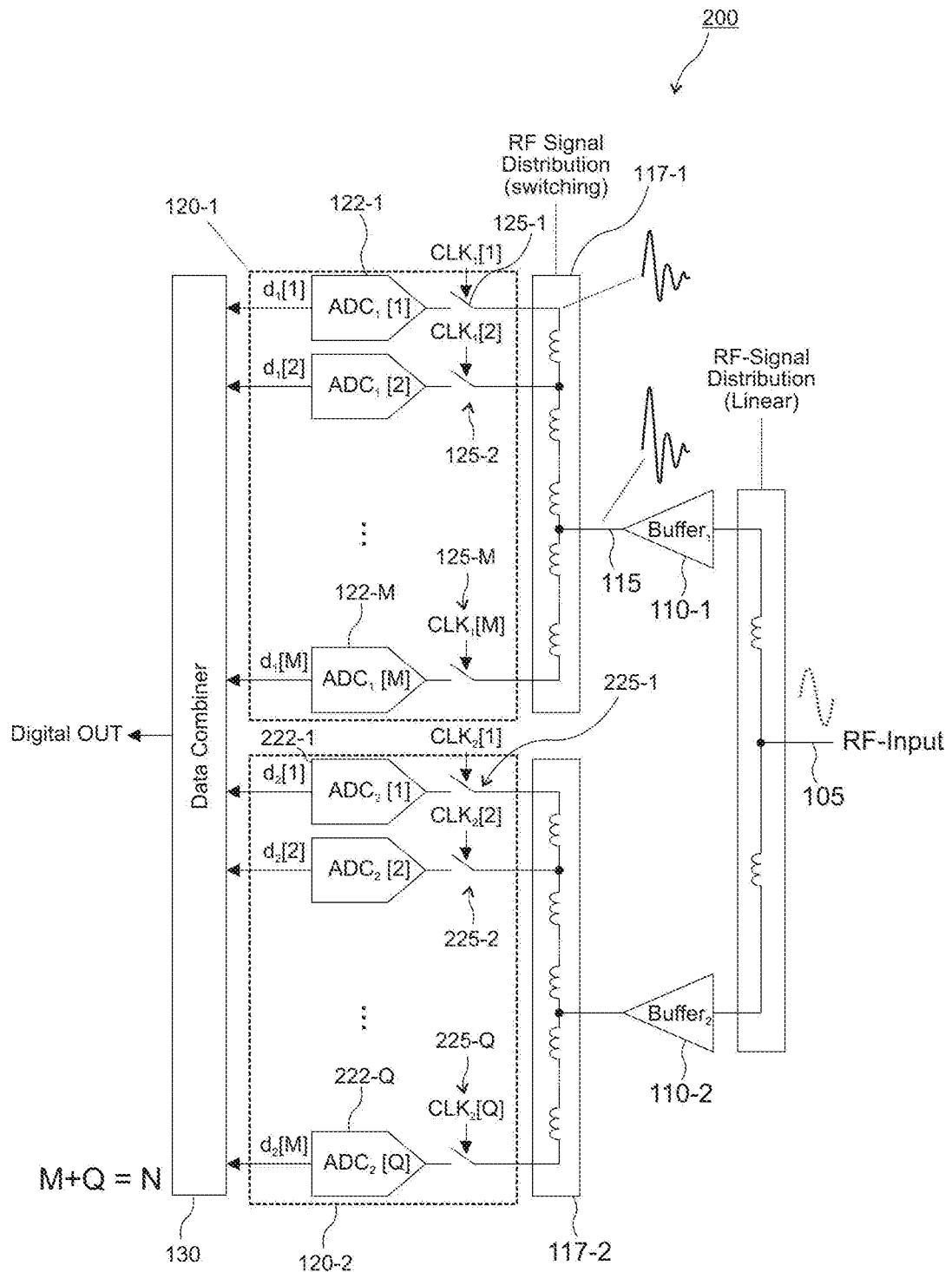
FIG. 2 shows a time-interleaved ADC comprising two sub-arrays driven by two RF-buffers.

Situation can be even worse in case the interleaving factor N increases beyond a certain limit, requiring to split the time-interleaved ADC-array 120 into multiple (at least two) sub-banks, or sub-arrays, where each ADC sub-array is driven by an individual RF-buffer, as depicted in FIG. 2 for an example of two time-interleaved ADC-sub-arrays 120-1, 120-2. The skilled person will appreciate that also more than two ADC-sub-arrays can be employed.

Compared to time-interleaved ADC circuit 100 of FIG. 1, time-interleaved ADC circuit 200 of FIG. 2 comprises a first time-interleaved ADC sub-array (bank) 120-1 and a second time-interleaved ADC sub-array (bank) 120-2. Time-interleaved ADC circuit 200 comprises a first buffer amplifier 110-1 assigned to the first time-interleaved ADC sub-array 120-1. The first buffer amplifier's output is coupled to the first time-interleaved ADC sub-array 120-1 via first (RF) signal distribution network 117-1. First buffer amplifier 110-1 may provide electrical impedance transformation from (RF) input 105 to the first time-interleaved ADC sub-array 120-1. Time-interleaved ADC circuit 200 also comprises a second buffer amplifier 110-2 assigned to the second time-interleaved ADC sub-array 120-2. The second buffer amplifier's output is coupled to the second time-interleaved ADC sub-array 120-2 via a second (RF) signal distribution network 117-2. Second buffer amplifier 110-2 may provide electrical impedance transformation from input 105 to the second time-interleaved ADC sub-array 120-2.

First time-interleaved ADC sub-array 120-1 comprises M parallel sub-ADCs 122-1, ..., 122-M. The input of each sub-ADC 122-1, ..., 122-M is coupled to the first buffer amplifier's 110-1 output via first (RF) signal distribution network 117-1 and respective switches 125-1, ..., 125-M. Second time-interleaved ADC bank 120-2 comprises Q parallel sub-ADCs 222-1, ..., 222-Q. The input of each sub-ADC 222-1, ..., 222-Q is coupled to the second buffer amplifier's output via second RF-signal distribution network 117-2 and respective switches 225-1, ..., 225-Q. The architecture of FIG. 2 can be found in multi-GS/s ADC, if performance limits are to be pushed any further requiring an increase in the interleaving factor M+Q=N. Typically, M=Q=N/2. Each of the N switches 125-1, ..., 125-M and 225-1, ..., 225-Q and hence each of the sub-ADCs 122-1, ..., 122-M and 222-1, ..., 222-Q is controlled by a clock with period $\hat{T}s = N \times Ts$.

Time-interleaved ADC circuit 200 is divided in two time-interleaved ADC sub-arrays 120-1, 120-2 (M, Q) each driven by a separate RF-Buffer 110-1, 110-2 through a dedicated RF-signal distribution 117-1, 117-2. Ideally, the N=M+Q sub-ADCs 122-1, ..., 122-M and 222-1, ..., 222-Q consecutively sample the input signal 105 at times n×Ts, where Ts is the sampling period of the time-interleaved ADC. This is achieved by having the sampling points of two consecutive sub-ADCs 122-1, ..., 122-M and 222-1, ..., 222-Q separated by a timing offset of Ts, where each sub-ADC 122-1, ..., 122-M and 222-1, ..., 222-0 has a clock period of $\hat{T}s = N \times Ts$. For example, a phase generator (not shown) may create the sub-ADC clocks.

As aforementioned, among time-varying errors the most critical in terms of its impact on overall ADC performance is the timing-skew, especially when input signals with multi-GHz frequencies are sampled.

Circuit mismatch (e.g. due transistor variations in threshold voltage or input capacitance) and signal trace or load variations may affect both the signal and clock propagation delay (jitter), resulting in non-zero timing skew, and may prevent the uniform sampling of the input signal across multiple ADC-slices.

In a multi-array or multi-bank time-interleaved ADC as depicted in FIG. 2, one of the most important timing-skew mismatch contributors is represented by the transition from one time-interleaved ADC sub-array to the other one. When the sampling sequence of the input signal crosses from the first time-interleaved ADC sub-array 120-1 to the second time-interleaved ADC sub-array 120-2, also the driving operation of the sub-ADC front-ends is handed over from one RF-buffer to the other. Each RF-buffer 110-1, 110-2 has by nature a settling time limitation due to finite slew-rate and signal bandwidth, unless an "infinite" biasing current would be provided, which is infeasible due to stringent power limitations.

As discussed in the previous sections, in a multi-GS/s time-interleaved ADC, the timing resolution requirement is sub-picosecond, and the slew-rate and bandwidth limitations of each RF-buffer 110-1, 110-2 may pose a serious obstacle to fulfil gain and timing-skew performance requirements without compromising significantly the power budget.

To mitigate timing skew, the present disclosure proposes time-interleaved ADC circuits with some modifications with respect to FIGS. 1 and 2. An example of a time-interleaved ADC circuit 300 in accordance with the present disclosure is shown in FIG. 3.

Time-interleaved ADC circuit 300 comprises an input 105 for an analog input signal. In some example implementations this may be an RF input signal. Time-interleaved ADC circuit 300 comprises a first ADC sub-array 120-1 comprising a first plurality of parallel time-multiplexed sub-ADCs 122-1, ..., 122-M. The first plurality of parallel time-multiplexed sub-ADCs 122-1, ..., 122-M is configured to subsequently generate a first plurality of digital samples $d_1[1], ..., d_1[M]$ of the analog input signal during a first sampling or A/D conversion time interval (from $CLK_1[1]$ to $CLK_1[M]$). A first buffer amplifier 110-1 is coupled between the input 105 and the first ADC sub-array 120-1. Time-interleaved ADC circuit 300 further comprises at least a second ADC sub-array 120-2 comprising a second plurality of parallel time-multiplexed sub-ADCs 222-1, ..., 222-Q. The second plurality of parallel time-multiplexed sub-ADCs 222-1, ..., 222-Q is configured to subsequently generate a second plurality of digital samples $d_2[1], \ldots, d_2[Q]$ of the analog input signal during a second sampling or A/D conversion time interval (from $CLK_2[1]$ to $CLK_2[Q]$). The first and the second time intervals associated with the respective ADC sub-arrays 120-1, 120-2 are subsequent time intervals in which the respective ADC sub-arrays 120-1, 120-2 are clocked for A/D conversion. A second buffer amplifier 110-2 is coupled between the input 105 and the second ADC sub-array 120-2. In accordance with the present disclosure, the first ADC sub-array 120-1 additionally comprises a first dummy sampler 322-1. Time-interleaved ADC circuit 300 is configured to activate the first dummy sampler 322-1 before the start of the first sampling time interval assigned to the first ADC sub-array 120-1 for sampling and converting the input signal. The second ADC sub-array 120-2 additionally comprises a second dummy sampler 322-2. Time-interleaved ADC circuit 300 is configured to activate the second dummy sampler 322-2 before the start of the second sampling time interval assigned to the second ADC sub-army 120-2 for sampling and converting the input signal.

Here, a dummy sampler refers to a circuit whose output is not connected to data combiner 130 and thus does not actively participate in generating the digitally converted output signal. A dummy sampler may comprise at least a switch and a capacitor and may thus correspond to a track and hold circuit. However, a dummy sampler does not produce a useful signal which is further processed. Its purpose rather is to provide a load to the respective buffer amplifier 110-1, 110-2, which is similar to the load provided by any of the sub-ADCs. The skilled person having benefit from the present disclosure will appreciate that each ADC sub-array 120-1, 120-2 could have more than one dummy sampler, for example two. The skilled person having benefit from the present disclosure will also appreciate that the proposed concept is not limited to time-interleaved ADC circuits with only two ADC sub-arrays but can be used for an arbitrary number of ADC sub-arrays.

Figure 3:
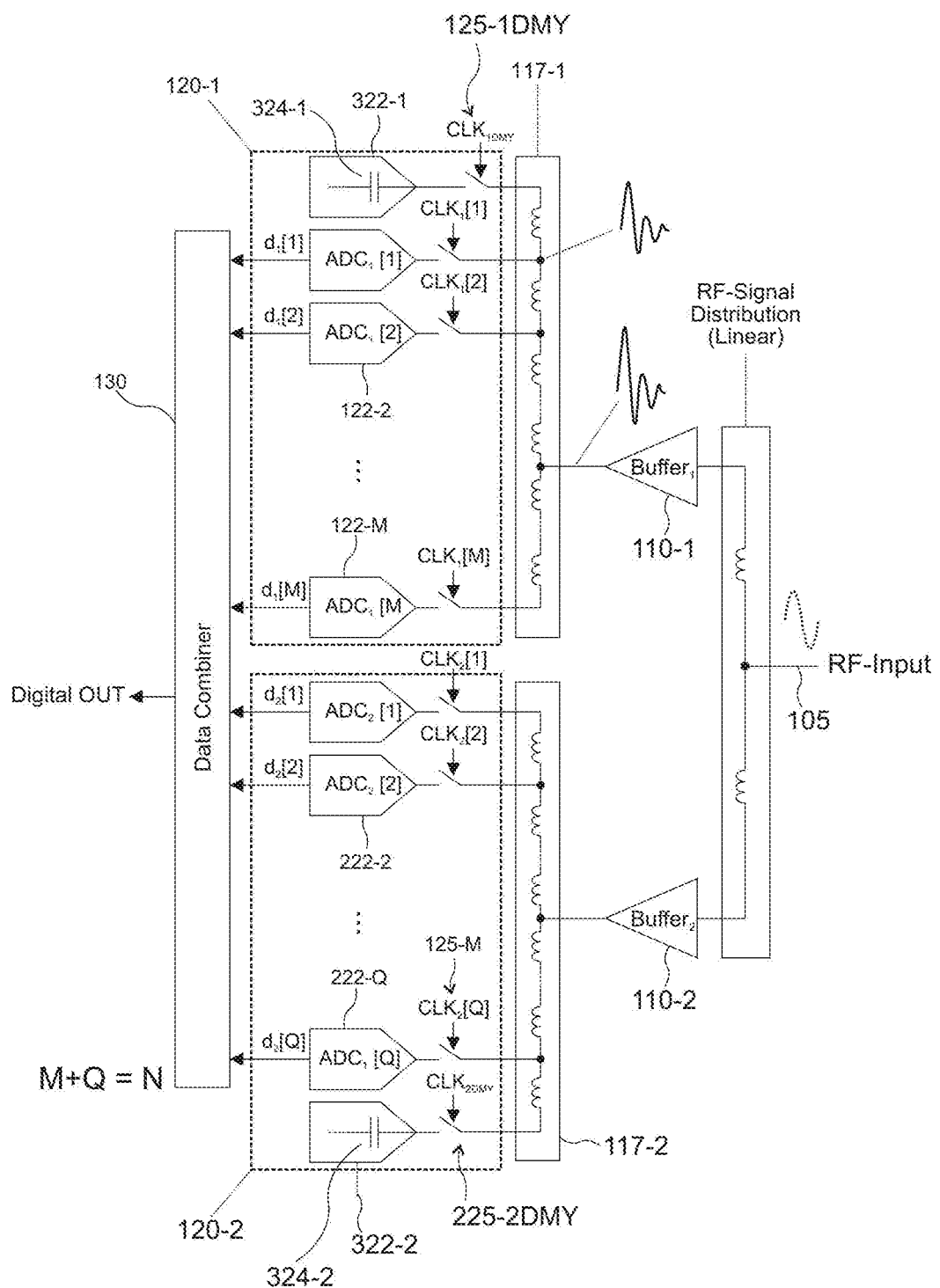
FIG. 3 shows time-interleaved ADC comprising two sub-arrays with respective dummy samplers in accordance with the present disclosure.

In the example shown in FIG. 3, the first dummy sampler 322-1 is connected to the output of first buffer amplifier 110-1 and in parallel to the first sub-ADCs 122-1, ..., 122-M. The second dummy sampler 322-1 is connected to the output of second buffer amplifier 110-2 and in parallel to the second sub-ADCs 222-1, ..., 222-Q. Their sampled analog voltages are not processed further. Thus, the dummy samplers 322-1, 322-2 can be regarded as open circuited.

In contrast to the sub-ADCs 122-1, ..., 122-M and 222-1, ..., 222-Q, the dummy samplers 322-1, 322-2 are not used as ADCs to convert the input signal from the analog to digital domain. Thus, time-interleaved ADC circuit 300 may be configured to discard (e.g., analog) samples of the analog input signal generated by the first and the second dummy sampler 322-1, 322-2. The dummy samplers 322-1, 322-2 may be configured to merely preload the respective RF-buffers 110-1, 110-2 with a correct dynamic load impedance at the transition idle-to-active of the respective ADC bank 120-1, 120-2, i.e. at the transition between the first and second time intervals. For example, the first dummy sampler 322-1 may be configured to mimic an input impedance of any one of the first plurality of parallel time-multiplexed sub-ADCs 122-1, ..., 122-M within a predefine tolerance range. Likewise, the second dummy sampler 322-2 may be configured to mimic an input impedance of any of the second plurality of parallel time-multiplexed sub-ADCs 222-1, ..., 222-Q within a predefine tolerance range. For example, it may be sufficient if the input impedance of a dummy sampler resembles the input impedance of a sub-ADC within a tolerance range of 20%, preferably 10%, or more preferably within a tolerance range of 5% of the sub-ADC's input impedance.

As mentioned before, each of the time-multiplexed sub-ADCs 122-1, ..., 122-M and 222-1, ..., 222-Q may comprise a respective input-sampling circuitry having a respective input switch 125 and a respective capacitor (not shown). Such input sampling circuitry is also commonly referred to as sample and hold or track and hold circuit. A typical sample and hold circuit stores electric charge in a capacitor and contains at least one switching device such as a FET (field effect transistor) switch and typically an operational amplifier. To sample the input signal, the switch 125 connects the capacitor to the output of a buffer amplifier 110. The buffer amplifier 110 charges or discharges the capacitor so that the voltage across the capacitor is practically equal, or proportional to, input voltage. In hold mode the switch 125 disconnects the capacitor from the buffer 110 and one or more comparators can be used to convert the input signal from analog to digital domain.

In some example implementations, each of the dummy samplers 322-1, 322-2 may comprise, just like the sub-ADCs 122-1, ..., 122-M and 222-1, ..., 222-Q, said track and hold circuit including an input switch 125-1DMY, 225-2DMY and a capacitor 324-1, 324-2 within predefined tolerance ranges. These tolerance ranges may correspond to typical manufacturing tolerance ranges of integrated circuit components, for example. Higher tolerance ranges are also conceivable if they can preload the respective RF-buffers 110-1, 110-2 with an adequate dynamic load impedance at the transition idle-to-active of the respective ADC sub-array 120-1, 120-2. One or more comparators for A/D conversion may but need not be present in the dummy samplers 322-1, 322-2. For example, each of the dummy samplers 322-1, 322-2 may comprise a second switch (not shown) connecting the capacitor 324-1, 324-2 to ground for discharging instead of holding the electric charge during hold mode (when input switches 125-1DMY, 225-2DMY are open).

In some example implementations, the first dummy sampler 322-1 may comprise the same circuit components like of any one of the first plurality of parallel time-multiplexed sub-ADCs 122-1, ..., 122-M within a predefine tolerance range. Likewise, the second dummy sampler 322-2 may comprise the same circuit components as of any one of the second plurality of parallel time-multiplexed sub-ADCs 222-1, ..., 222-Q within a predefine tolerance range. That is to say, the dummy samplers 322-1, 322-2, though not used as ADCs, may be, within manufacturing tolerances, complete circuit replicas of the (identical) sub-ADCs 122-1, ..., 122-M and 222-1, ..., 222-Q.

In some example implementations, a control circuit (not shown) may be configured to activate the first dummy sampler 322-1 by closing switch 125-1DMY via clock signal $CLK_{1DMY}$ at the transition from the second A/D conversion time interval assigned to the second ADC sub-array 120-2 to the first A/D conversion time interval assigned to the first ADC sub-array 120-1. Likewise, the control circuit (not shown) may be configured to activate the second dummy sampler 322-2 by closing switch 125-2DMY via clock signal $CLK_{2DMY}$ at the transition from the first A/D conversion time interval assigned to the first ADC sub-array 120-1 to the second A/D conversion time interval assigned to the second ADC sub-array 120-2. The dummy samplers 322-1, 322-2 may be activated right before the transition idle-to-active of the respective ADC sub-arrays 120-1, 120-2, in order to preload and "wake-up" the respective RF-buffer with the correct (dynamic and possibly nonlinear) load impedance, allowing a smooth transition between ADC sub-arrays 120-1, 120-2, mitigating significantly timing-skew and encompassing additional time-varying errors such as gain and bandwidth mismatch.

In some example implementations, the control circuit (not shown) may be configured to activate the first dummy sampler 322-1 one clock cycle before a first clock cycle of the first A/D conversion time interval in which a first one of the first plurality of parallel time-multiplexed sub-ADCs 122-1, . . . , 122-A is activated (by closing the respective switch 125-1, . . . , 125-M). Likewise, the second dummy sampler 322-2 may be activated one clock cycle before a first clock cycle of the second A/D conversion time interval in which a first one of the second plurality of parallel time-multiplexed sub-ADCs 222-1, . . . , 222-Q is activated (by closing the respective switch 225-1, . . . , 225-Q).

Figure 4A:
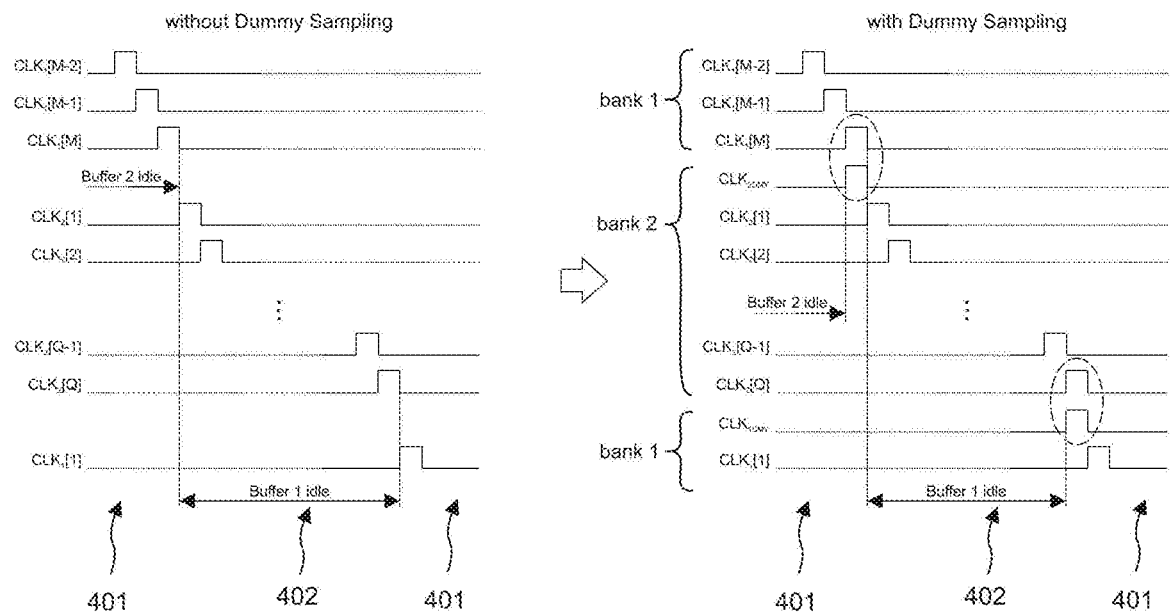
FIG. 4A shows examples of sequential sampling with and without dummy samplers.

FIG. 4A illustrates an example of a sequential sampling scenario, i.e. a scenario where the sub-ADCs 122-1, . . . , 122-A of the first ADC sub-array 120-1 are clocked consecutively in ascending order during a first A/D conversion time interval 401 and where the sub-ADCs 222-1, . . . , 222-Q of the second ADC sub-array 120-2 are clocked consecutively in ascending order during a second A/D conversion time interval 402. First ADC sub-array 120-1 is idle during the second A/D conversion time interval 402. Second ADC sub-array 120-2 is idle during the first A/D conversion time interval 401. While the left portion of FIG. 4A shows a scenario without dummy sampling, the right portion of FIG. 4A shows a scenario with dummy sampling.

As shown in the right portion of FIG. 4A, the control circuit (not shown) may be configured to activate the first dummy sampler 322-1 (using $CLK_{1DMY}$) during a last clock cycle (e.g. $CLK_2[Q]$) of the second A/D conversion time interval 402 in which a last one of the second plurality of parallel time-multiplexed sub-ADCs 222-1, . . . , 222-Q is activated. For example, the first dummy sampler 322-1 may be activated in parallel (concurrently) to sub-ADC 222-Q. Similarly, the second dummy sampler 322-2 may be activated (using $CLK_{2DMY}$) during a last clock cycle (e.g. $CLK_1[M]$) of the first A/D conversion time interval 401 in which a last one of the first plurality of parallel time-multiplexed sub-ADCs 122-1, . . . , 122-M is activated. For example, the second dummy sampler 322-2 may be activated in parallel (concurrently) to sub-ADC 122-M.

An activation protocol of the dummy samplers 322-1, 322-2 may be handled entirely in the digital domain. FIG. 4A depicts a timing diagram in a sequential sampling scenario high-lighting the differences with and without dummy sampler activation. Sub-ADCs are activated in sequential mode [1 . . . M] for ADC sub-array 120-1, then [1 . . . Q] for ADC sub-array 120-2. In case with dummy sampling, $CLK_{2DMY}$ is set high simultaneously to the last sub-ADC [M] of ADC sub-array 120-1 to "prepare" the RF-Buffer 110-2 to the imminent next transition and acquisition from sub-ADCs of ADC sub-array 120-2. The same will happen with $CLK_{1DMY}$ going high at the last acquisition from ADC sub-array 120-2 (sub-ADC[Q]).

Figure 4B:
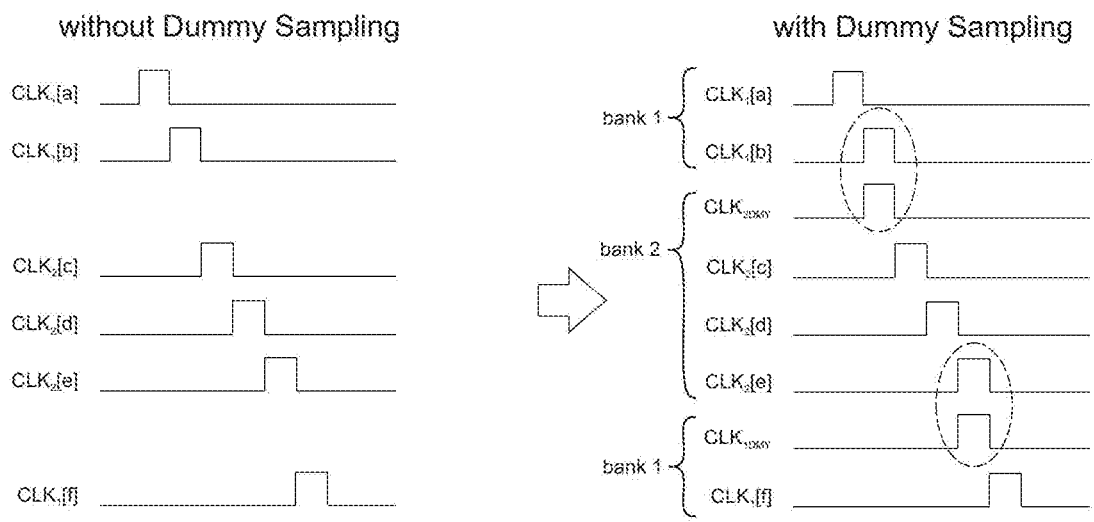
FIG. 4B shows examples of random sampling with and without dummy samplers.

FIG. 4B shows an example of a random sampling scenario. Similarly, to the sequential case, the activation of the respective dummy sampler happens at the transition from one ADC sub-array to the other. Of course, other switching scenarios are also possible.

The skilled person having benefit from the present disclosure will appreciate that each ADC sub-array could have more than one dummy sampler assigned to it, for example two, where a respective first dummy sampler would be activated during the pre-last sample of the pre-ceding ADC-sub-array, the respective second dummy sampler then during its last sample, as described here. Additional dummy samplers may provide more start-up time for buffer settling, for example.

Figure 5:
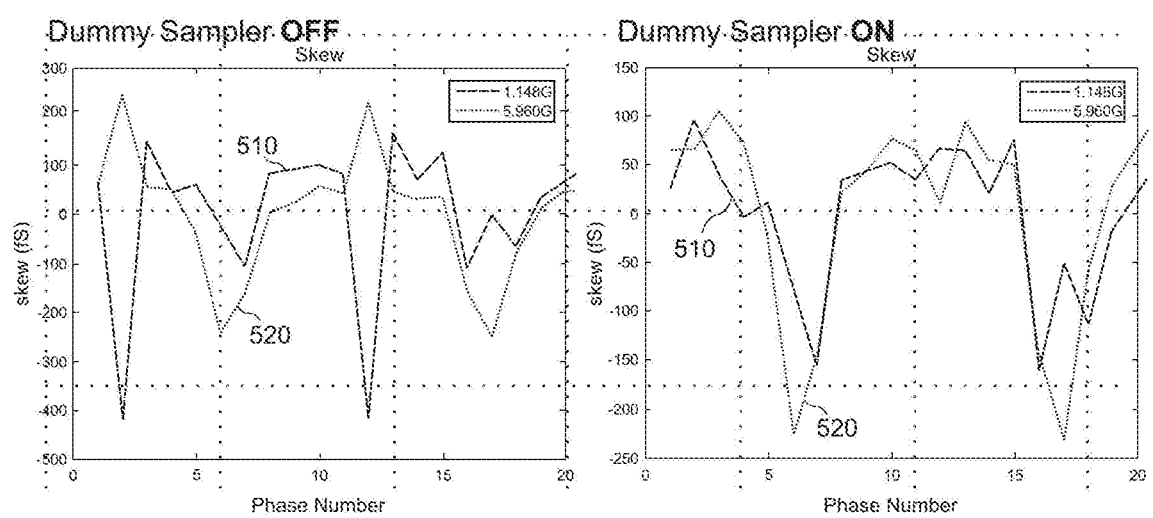
FIG. 5 shows a timing skew comparison of time-interleaved ADC vs. frequency.

FIG. 5 demonstrates the viability of the proposed solution showing an idle-to-active transitions of two different RF-buffers driving two ADC sub-arrays (as shown in FIG. 2 and FIG. 3), which happen respectively at phase number [2] and [11]. The results from analyzing timing skew are more interesting than those of both gain and offset, as they depend on the "speed" of the input signal. Reference numeral 510 refers to an input signal of 1.148 GHz, reference numeral 520 refers to an input signal of 5.960 GHz. This is important, since the speed, or the rate of change, of the input signal is directly proportional to the sampling error a given timing skew profile will create. As can be seen from the right portion of FIG. 5 (dummy sampler: ON), the proposed circuit implementation may help to mitigate the impact of the residual timing skew, which is generally not within the designer's control. These results highlight a remarkable reduction of timing skew frequency dependency and mismatch across sub-ADCs of a multi-GS/s TI-ADC, when the dummy sampler is activated in the sampling instant directly before the respective RF-buffer goes online, i.e. starts driving ADC-slices in his respective sub-array.

Figure 6A:
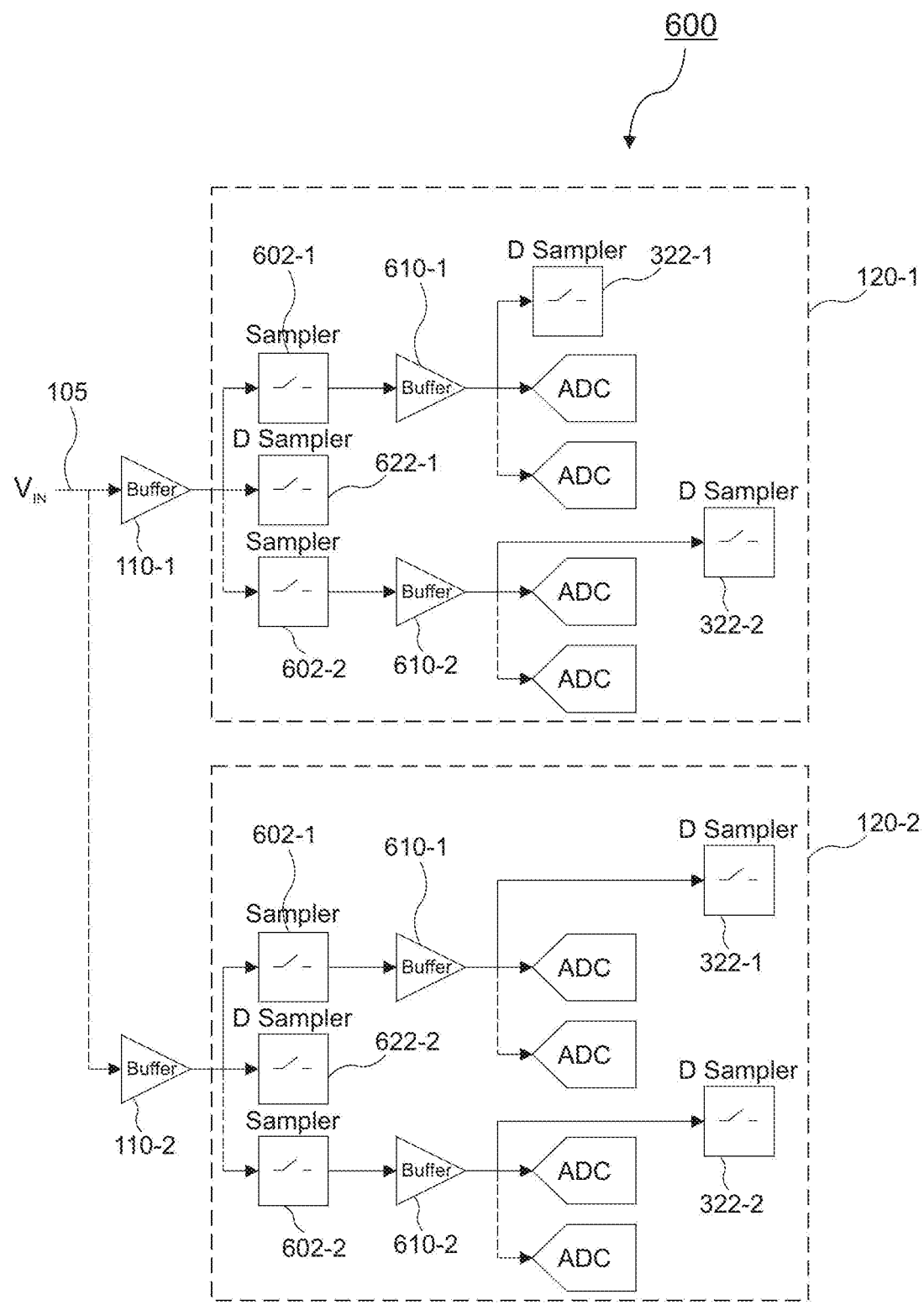
FIGS. 6A-C shows further examples of time-interleaved ADCs comprising multiple ADC sub-arrays with respective dummy samplers in accordance with the present disclosure.
Figure 6B:
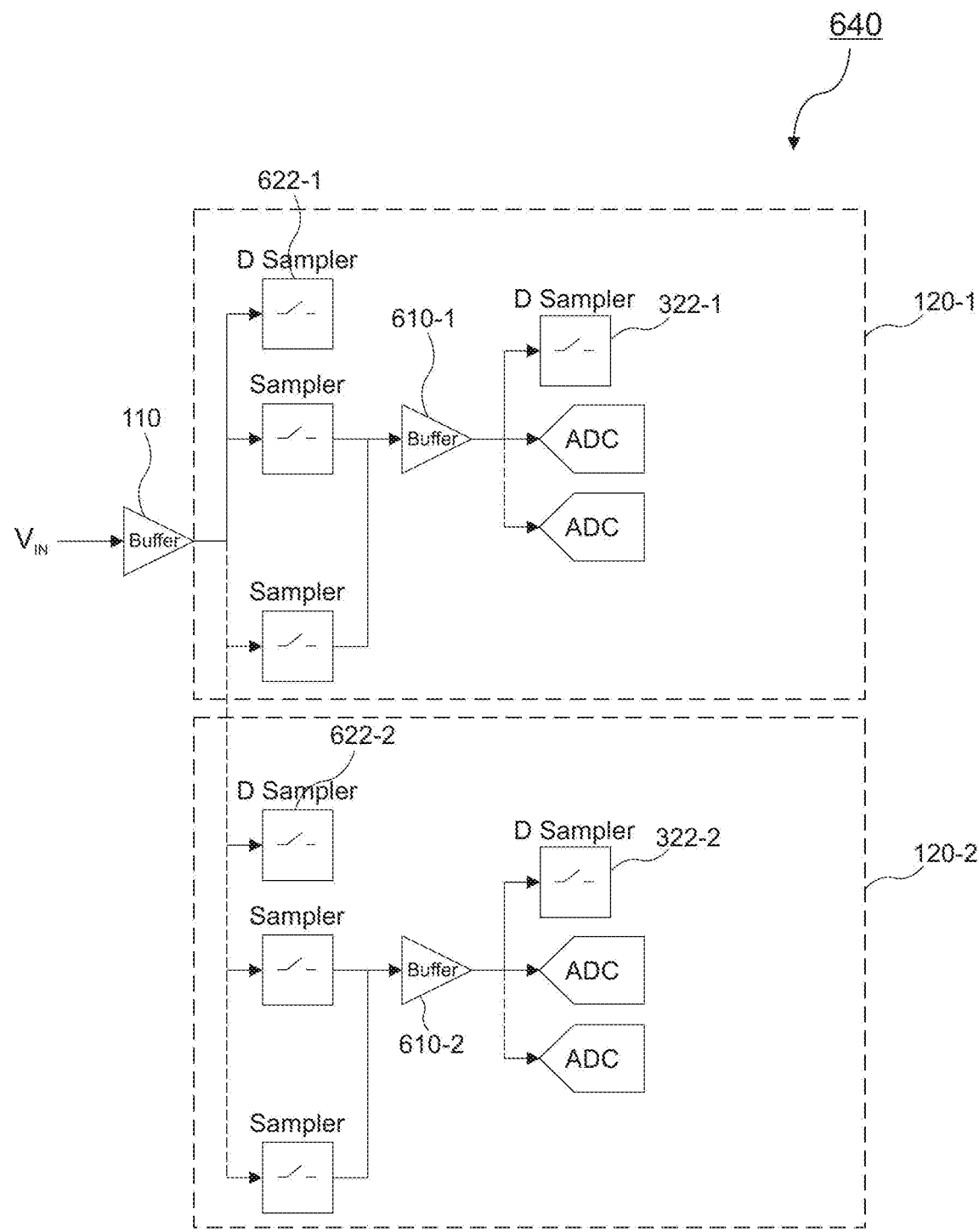
Figure 6C:
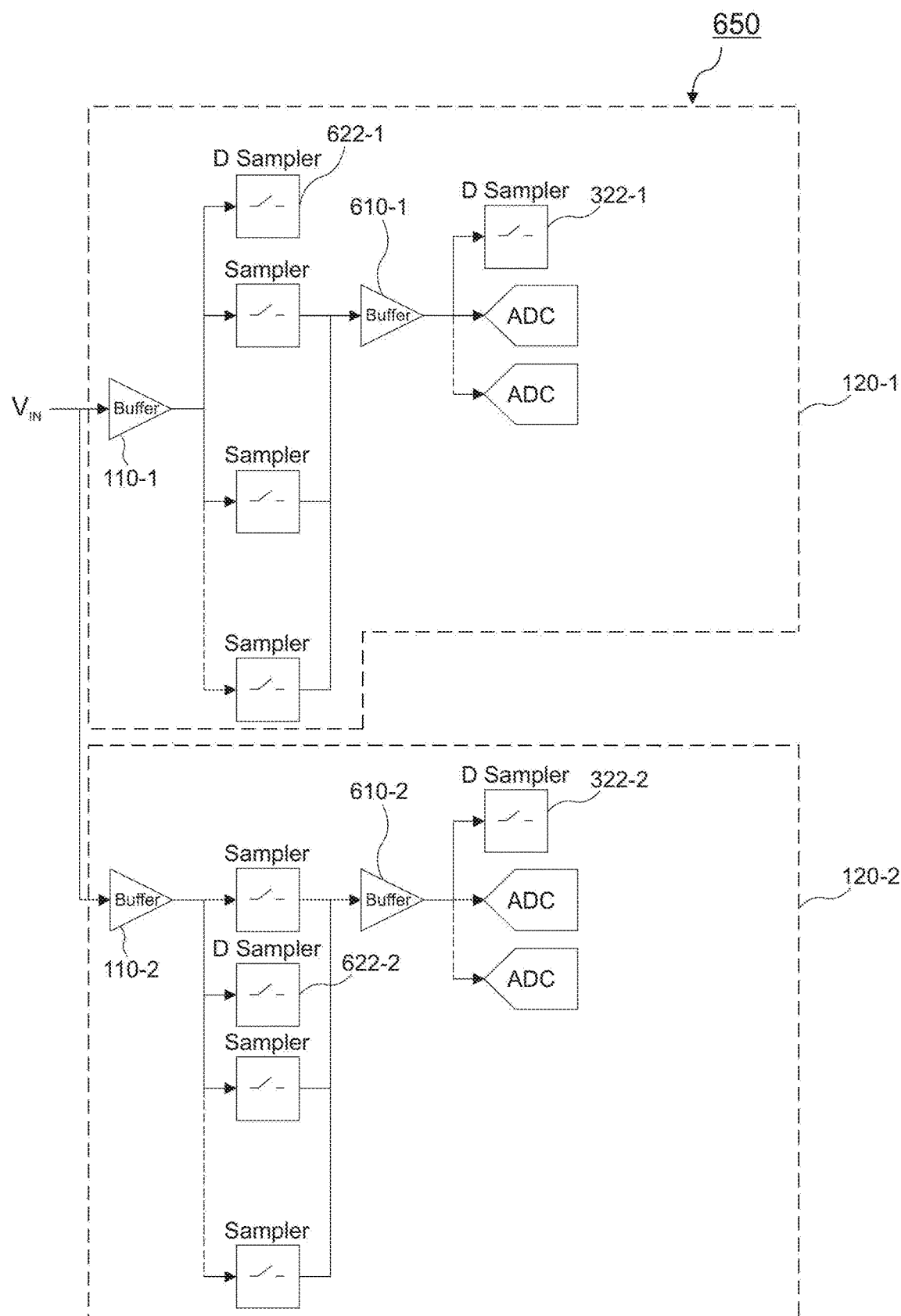

FIG. 6A-C show some further example implementations of time-interleaved ADC circuits in accordance with the present disclosure.

Time-interleaved ADC circuit 600 of FIG. 6A comprises an input 105. Input 105 is coupled to a primary buffer amplifier 110-1. The output of primary buffer amplifier 110-1 is coupled to a plurality of parallel time-multiplexed samplers (T/H circuits) 602-1, 602-2. Further, the output of primary buffer amplifier 110-1 is coupled to a dummy sampler 622-1. The output of dummy sampler 622-1 is unconnected. The output of sampler 602-1 is coupled to a secondary buffer amplifier 610-1. The output of secondary buffer amplifier 610-1 is coupled to a first ADC sub-array 120-1 comprising one or more time-multiplexed sub-ADCs. Further, the output of secondary buffer amplifier 610-1 may optionally be coupled to a further dummy sampler 322-1. The output of sampler 602-2 is coupled to another secondary buffer amplifier 610-2. The output of secondary buffer amplifier 610-2 is coupled to a second ADC sub-array 120-2 comprising one or more time-multiplexed sub-ADCs. Further, the output of secondary buffer amplifier 610-2 may optionally be coupled to another dummy sampler 322-2. The circuit connected to the output of primary buffer amplifier 110-1 may be referred to as first ADC bank 120-1 which is active for A/D conversion during a first time interval.

Optionally, input 105 may be coupled to a further primary buffer amplifier 110-2. Like in the upper branch, the output of primary buffer amplifier 110-2 in the lower branch may be coupled to a plurality of parallel time-multiplexed samplers (T/H circuits) 602-1, 602-2. Further, the output of primary buffer amplifier 110-1 may optionally be coupled to a dummy sampler 622-2. The output of dummy sampler 622-2 may be unconnected. The output of sampler 602-1 is coupled to a secondary buffer amplifier 610-1. The output of secondary buffer amplifier 610-1 is coupled to a first ADC sub-array 120-1 comprising one or more time-multiplexed sub-ADCs. Further, the output of secondary buffer amplifier 610-1 may be coupled to a dummy sampler 322-1. The output of sampler 602-2 is coupled to another secondary buffer amplifier 610-2. The output of secondary buffer amplifier 610-2 is coupled to a second ADC sub-array 120-2 comprising one or more time-multiplexed sub-ADCs. Further, the output of secondary buffer amplifier 610-2 may optionally be coupled to another dummy sampler 322-2. The circuit connected to the output of primary buffer amplifier 110-2 may be referred to as second ADC bank 120-2 which is active for A/D conversion during a second time interval.

Time-interleaved ADC circuit 600 having the plurality of parallel time-multiplexed samplers 602-1, 602-2 may be beneficial to mitigate negative signal distribution effects, for example if a signal distribution network 117 from input 105 to the ADC sub-arrays 120-1, 120-2 includes signal lines with significant inductances.

Similar to what has been described before, dummy sampler 622-1 1 of the first ADC bank 120-1 may be activated at the transition from the second time interval to the first time interval in the example of FIG. 6A. The dummy sampler 622-2 of the second ADC bank 120-2 may be activated at the transition from the first time interval to the second time interval. For example, dummy sampler 622-1 of the first ADC bank 120-1 may be activated one clock cycle before a first clock cycle of the first time interval in which a first one of the plurality of parallel time-multiplexed samplers 602-1, 602-2 of the first ADC bank 120-1 is activated. Dummy sampler 622-2 of the second ADC bank 120-2 may be activated one clock cycle before a first clock cycle of the second time interval in which a first one of the plurality of parallel time-multiplexed samplers 602-1, 602-2 of the second ADC bank 120-2 is activated. Similar activation/switching scenarios are possible to what has been described above with regards to FIGS. 3 and 4.

FIG. 6A illustrates a concept showing the possibility to have, one (or more input buffers), followed by one (or more) samplers with a secondary buffer which later connects to one (or more ADCs). This is similar as to what has been escribed before, but there is an additional level of samplers between the ADCs and the previous buffer. The extra dummy sampler may then be placed in parallel to the other samplers (per buffer), and/or in parallel to the ADCs.

Similar time-interleaved ADC circuits 640 and 650 are shown in FIGS. 6B and 6C. Here, also two (or more) samplers may be connected in parallel, and then followed by a secondary buffer and then the ADCs. And like above, the extra dummy sampler may then be placed in parallel to the samplers (per buffer), and/or in parallel to the ADCs. As a difference to FIG. 6A, the time-interleaved ADC circuit 640 shows a first plurality of time-multiplexed samplers connected in parallel between primary buffer amplifier 110 and secondary buffer amplifier 610-1 as well as a second plurality of time-multiplexed samplers connected in parallel between primary buffer amplifier 110 and secondary buffer amplifier 610-2. Again, the dummy sampler 622-1 may be activated at the transition from the second time interval (assigned to the second ADC bank 120-2) to the first time interval (assigned to the first ADC bank 120-1) in the example of FIG. 6B. The dummy sampler 622-2 may be activated at the transition from the first time interval to the second time interval. Details on the scheduling have been explained above.

In the examples of FIG. 6A-C, the first/second ADC bank 120-1/120-2 comprises a first/second plurality of parallel time-multiplexed samplers 602-1, 602-2 coupled between the first/second buffer amplifier 110-1/110-2 and the first/second plurality of parallel time-multiplexed ADCs. The first/second dummy sampler 622-1/622-2 is coupled to the first/second buffer amplifier 110-1/110-2 in parallel to the first/second plurality of parallel time-multiplexed samplers 602-1, 602-2. The time-interleaved ADC circuits may further comprise one or more third/fourth buffer amplifiers 610-1/610-2 coupled between the first/second plurality of parallel time-multiplexed samplers 602-1, 602-2 and the first plurality of parallel time-multiplexed ADCs.

Figure 7:
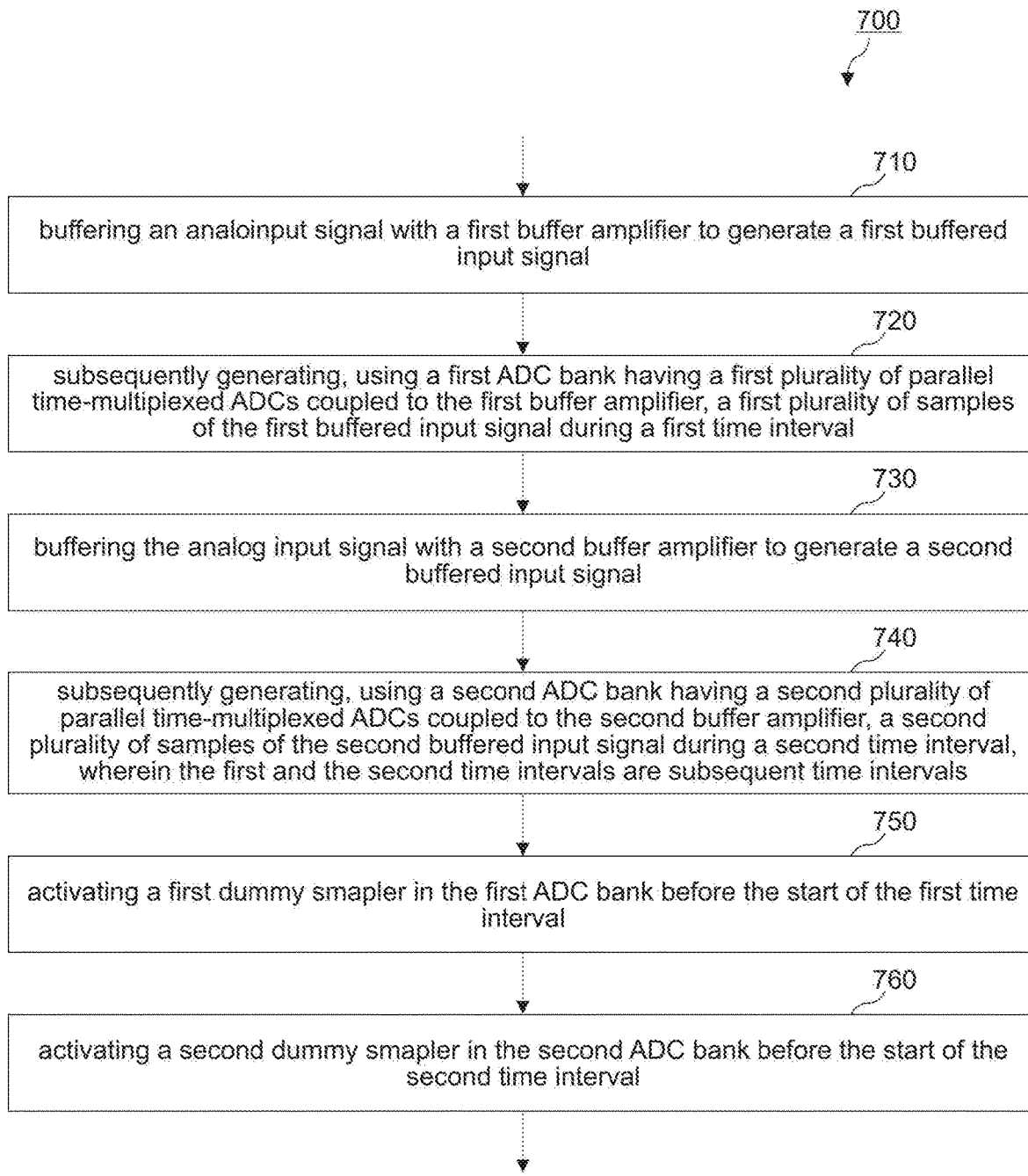
FIG. 7 shows a flowchart of a time-interleaved analog-to-digital conversion method in accordance with the present disclosure.

To summarize the proposed concept, FIG. 7 illustrates a flowchart of a time-interleaved analog-to-digital conversion method 600.

Method 700 includes an act 710 of buffering an analog input signal with a first buffer amplifier to generate a first buffered input signal. Method 700 further includes an act 720 of subsequently generating, using a first ADC bank having a first plurality of parallel time-multiplexed ADCs coupled to the first buffer amplifier, a first plurality of samples of the first buffered input signal during a first time interval. Method 700 further includes an act 730 of buffering the analog input signal with a second buffer amplifier to generate a second buffered input signal. Method 700 further includes an act 740 of subsequently generating, using a second ADC bank having a second plurality of parallel time-multiplexed ADCs coupled to the second buffer amplifier, a second plurality of samples of the second buffered input signal during a second time interval. The first and the second time intervals are subsequent time intervals. Method 700 further includes an act 750 of activating a first dummy sampler coupled to the first buffer amplifier and associated with the first ADC bank before the start of the first time interval, and an act 660 of activating a second dummy sampler coupled to the second buffer amplifier and associated with the second ADC bank before the start of the second time interval.

The proposed concept may be particularly attractive for millimeter wave communication circuitry, such as 5G basestations, for example.

Figure 8:
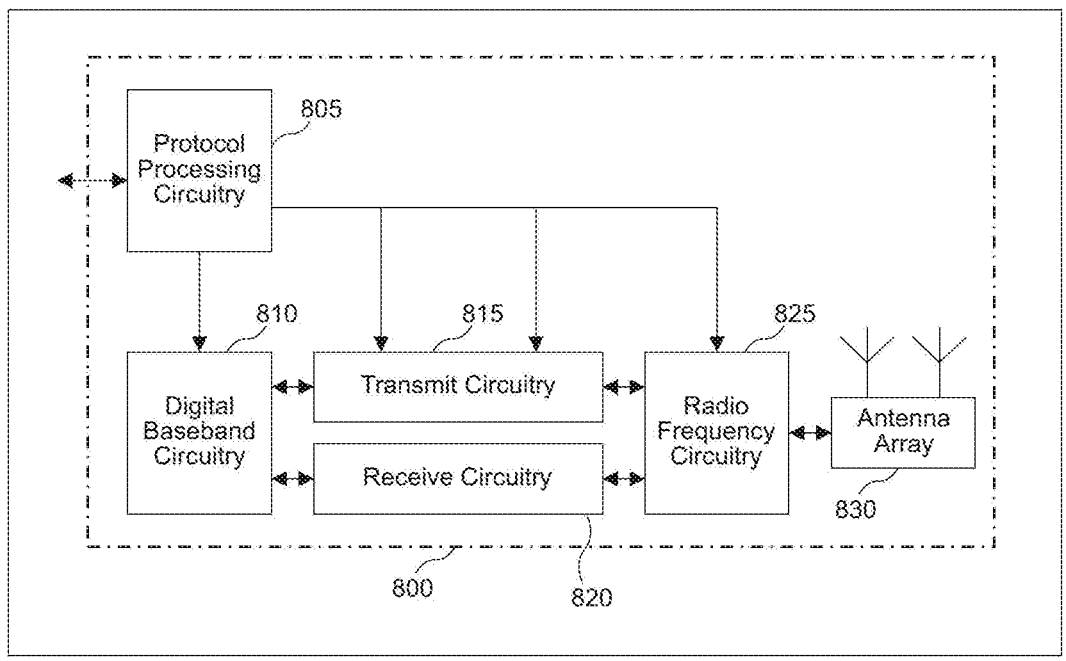
FIG. 8 illustrates a block diagram of a base station for wireless communications.

FIG. 8 illustrates an exemplary millimeter wave communication circuitry 800, such as a base station communication circuitry, in which examples of the proposed time-interleaved analog-to-digital conversion may be used. Circuitry 800 is alternatively grouped according to functions. Components as shown in 800 are shown here for illustrative purposes and may include other components not shown here in FIG. 7.

Millimeter wave communication circuitry 800 may include protocol processing circuitry 805, which may implement one or more of medium access control (MAC), radio link control (RLC), packet data convergence protocol (PDCP), radio resource control (RRC) and non-access stratum (NAS) functions. Protocol processing circuitry 805 may include one or more processing cores (not shown) to execute instructions and one or more memory structures (not shown) to store program and data information.

Millimeter wave communication circuitry 800 may further include digital baseband circuitry 810, which may implement physical layer (PHY) functions including examples of the proposed nonlinear signal processing, one or more of hybrid automatic repeat request (HARQ) functions, scrambling and/or descrambling, coding and/or decoding, layer mapping and/or de-mapping, modulation symbol mapping, received symbol and/or bit metric determination, multi-antenna port pre-coding and/or decoding which may include one or more of space-time, space-frequency or spatial coding, reference signal generation and/or detection, pre-amble sequence generation and/or decoding, synchronization sequence generation and/or detection, control channel signal blind decoding, and other related functions.

Millimeter wave communication circuitry 800 may further include transmit circuitry 815, receive circuitry 820 and/or antenna array circuitry 830. The transmit circuitry 815 may include one or more of digital to analog converters (DACs) 840, analog baseband circuitry 845, up-conversion circuitry 850 and filtering and amplification (PA) circuitry 855. Millimeter wave communication circuitry 700 may further include radio frequency (RF) circuitry 825. In an aspect of the disclosure, RF circuitry 825 may include multiple parallel RF chains for one or more of transmit or receive functions, each connected to one or more antennas of the antenna array 830. In an aspect of the disclosure, protocol processing circuitry 805 may include one or more instances of control circuitry (not shown) to provide control functions for one or more of digital baseband circuitry 810, transmit circuitry 815, receive circuitry 820, and/or radio frequency circuitry 825. Examples of the proposed time-interleaved analog-to-digital conversion concept may be implemented in receive circuitry 820, for example. In this way, Intermediate Frequency (IF) down-conversion circuitry, IF processing circuitry, baseband down-conversion circuitry may be omitted, for example.

The present disclosure proposes the use of a dummy sampler in a circuit arrangement that preloads an RF-buffer with the correct dynamic load impedance, at the transition idle-to-active, in a multi-array time-interleaved multi-GS/s ADC. Multi-array specifically means that the whole time-interleaved ADC is split into at least (but possibly more) two sub-banks consisting of a given number of sub-ADCs (=ADC-slices). Each sub-bank of the time-interleaved ADC is driven by a dedicated RF-buffer. In the preferred implementation, no front-end T/H is used, but the proposed concept does not require that.

The use of a dummy sampler in the time-interleaved analog-to-digital conversion circuit arrangement, proposed in FIG. 3, may offer remarkable advantages. The dummy sampler(s) can be either a complete replica of a sub-ADC, or just a replica of the front-end stage of it. The dummy sampler may be activated right before the transition idle-to-active, in order to preload and "wake-up" the RF-Buffer with the correct (dynamic and possibly nonlinear) load impedance, allowing a smooth transition between ADC banks, mitigating significantly timing-skew and encompassing additional time-varying errors such as gain and bandwidth mismatch. The cost may be in a small area and supply current increase (one dummy sampler per array), in any case much less than trying to increase the RF-buffer slew rate and bandwidth for achieving the same performance. The activation protocol as well as the control may be defined in the digital domain, maximizing the flexibility, and guarantying an optimal use in different scheduling scenario (e.g. scrambler/random, sequential sampling, ping-pong etc.). The presented solution offers a high level of modularity, giving the possibility to replicate the same idea to use a dummy sampler in additional ADC sub-arrays in case, for example, time-interleaving factor increases (more than two input RF-Buffers), since it's a design parameter to push performance limits any further.

The following examples pertain to further embodiments.

Example 1 is a time-interleaved ADC circuit comprising an input for an analog input signal, a first ADC bank comprising a first plurality of parallel time-multiplexed ADCs, wherein the first plurality of parallel time-multiplexed ADCs is configured to subsequently generate a first plurality of samples of the analog input signal during a first time interval, a first buffer amplifier coupled between the input and the first ADC bank, a second ADC bank comprising a second plurality of parallel time-multiplexed ADCs, wherein the second plurality of parallel time-multiplexed ADCs is configured to subsequently generate a second plurality of samples of the analog input signal during a second time interval, wherein the first and the second time intervals are subsequent time intervals, a second buffer amplifier coupled between the input and the second ADC bank. The first ADC bank has associated therewith a first dummy sampler coupled to the first buffer amplifier, wherein the ADC circuit is configured to activate the first dummy sampler before the start of the first time interval. The second ADC bank has associated therewith a second dummy sampler coupled to the second buffer amplifier, wherein the ADC circuit is configured to activate the second dummy sampler before the start of the second time interval.

In Example 2, the first dummy sampler is coupled to the first buffer amplifier in parallel to the first plurality of parallel time-multiplexed ADCs, and the second dummy sampler is coupled to the second buffer amplifier in parallel to the second plurality of parallel time-multiplexed ADCs.

In Example 3, the first ADC bank comprises a first plurality of parallel time-multiplexed samplers coupled between the first buffer amplifier and the first plurality of parallel time-multiplexed ADCs, wherein the first dummy sampler is coupled to the first buffer amplifier in parallel to the first plurality of parallel time-multiplexed samplers. The second ADC bank comprises a second plurality of parallel time-multiplexed samplers coupled between the second buffer amplifier and the second plurality of parallel time-multiplexed ADCs, wherein the second dummy sampler is coupled to the second buffer amplifier in parallel to the second plurality of parallel time-multiplexed samplers.

In Example 4, the first plurality of parallel time-multiplexed samplers may be coupled between the first buffer amplifier an at least one third buffer amplifier, wherein the first plurality of parallel time-multiplexed ADCs is coupled to the at least one third buffer amplifier. The second plurality of parallel time-multiplexed samplers may be coupled between the second buffer amplifier an at least one fourth buffer amplifier, wherein the second plurality of parallel time-multiplexed ADCs is coupled to the at least one fourth buffer amplifier.

In Example 5, the ADC circuit comprises a control circuit configured to activate the first dummy sampler at the transition from the second time interval to the first time interval and to activate the second dummy sampler at the transition from the first time interval to the second time interval.

In Example 6, the ADC circuit comprises a control circuit configured to activate the first dummy sampler one clock cycle before a first clock cycle of the first time interval in which a first one of the first plurality of parallel time-multiplexed ADCs is activated and to activate the second dummy sampler one clock cycle before a first clock cycle of the second time interval in which a first one of the second plurality of parallel time-multiplexed ADCs is activated.

In Example 7, the ADC circuit comprises a control circuit configured to activate the first dummy sampler during a last clock cycle of the second time interval in which a last one of the second plurality of parallel time-multiplexed ADCs is activated and to activate the second dummy sampler during a last clock cycle of the first time interval in which a last one of the first plurality of parallel time-multiplexed ADCs is activated.

In Example 8, each of the time-multiplexed ADCs comprises a respective input-sampling circuitry having a respective input switch, a respective capacitor, and a respective digitizer for digitizing a potential of the capacitor.

In Example 9, the ADC circuit is configured to discard samples of the analog input signal generated by the first and the second dummy sampler.

In Example 10, the first dummy sampler is configured to mimic an input impedance of any one of the first plurality of parallel time-multiplexed ADCs within a predefine tolerance range, and wherein the second dummy sampler is configured to mimic an input impedance of any of the second plurality of parallel time-multiplexed ADCs within a predefine tolerance range.

In Example 11, each of the time-multiplexed ADCs comprises an input-sampling circuitry having an input switch and a capacitor, and wherein each of the dummy samplers comprises said input switch and said capacitor within predefined tolerance ranges.

In Example 12, the first dummy sampler comprises the same circuit components as of any one of the first plurality of parallel time-multiplexed ADCs within a predefine tolerance range, and wherein the second dummy sampler comprises the same circuit components as of any one of the second plurality of parallel time-multiplexed ADCs within a predefine tolerance range.

In Example 13, the analog input signal is an RF signal.

In Example 14, the time-interleaved ADC circuit is an integrated CMOS circuit.

Example 15 is base station for wireless communications. The base station comprises a time-interleaved ADC circuit. The time-interleaved ADC circuit comprises an input for an analog RF signal, a first ADC bank comprising a plurality of first parallel time-multiplexed ADCs, wherein the first parallel time-multiplexed ADCs are configured to subsequently generate respective first samples of the analog RF signal during a first sampling time interval, a first voltage buffer coupled between the input and the first ADC bank, a second ADC bank comprising a plurality of second parallel time-multiplexed ADCs, wherein the second parallel time-multiplexed ADCs are configured to subsequently generate respective second samples of the analog RF signal during a second sampling time interval, wherein the first and the second sampling time intervals are subsequent time intervals, a second voltage buffer coupled between the input and the second ADC bank, wherein the first ADC bank additionally comprises a first dummy sampler, wherein the time-interleaved ADC circuit is configured to activate the first dummy sampler before the start of the first sampling time interval, and the second ADC bank additionally comprises a second dummy sampler, wherein the time-interleaved ADC circuit is configured to activate the second dummy sampler before the start of the second sampling time interval.

In Example 16, the time-interleaved ADC circuit is configured not to use samples of the analog input signal generated by the first and the second dummy sampler.

Example 17 is a time-interleaved analog-to-digital conversion method, the method comprising buffering an analog input signal with a first buffer amplifier to generate a first buffered input signal, subsequently generating, using a first ADC bank having a first plurality of parallel time-multiplexed ADCs coupled to the first buffer amplifier, a first plurality of samples of the first buffered input signal during a first time interval, buffering the analog input signal with a second buffer amplifier to generate a second buffered input signal, subsequently generating, using a second ADC bank having a second plurality of parallel time-multiplexed ADCs coupled to the second buffer amplifier, a second plurality of samples of the second buffered input signal during a second time interval, wherein the first and the second time intervals are subsequent time intervals, activating a first dummy sampler associated with the first ADC bank before the start of the first time interval, and activating a second dummy sampler associated with the second ADC bank before the start of the second time interval.

In Example 18, activating the first dummy sampler comprises preloading the first buffer amplifier with a load impedance of any one of the first plurality of parallel time-multiplexed ADCs within a predefine tolerance range, and wherein activating the second dummy sampler comprises preloading the second buffer amplifier with a load impedance of any one of the second plurality of parallel time-multiplexed ADCs within a predefine tolerance range.

In Example 19, the first and the second dummy sampler are not used for generating samples of the respective buffered input signals.

The aspects and features described in relation to a particular one of the previous examples may also be combined with one or more of the further examples to replace an identical or similar feature of that further example or to additionally introduce the features into the further example.

Examples may further be or relate to a (computer) program including a program code to execute one or more of the above methods when the program is executed on a computer, processor, or other programmable hardware component. Thus, steps, operations, or processes of different ones of the methods described above may also be executed by programmed computers, processors, or other programmable hardware components. Examples may also cover program storage devices, such as digital data storage media, which are machine-, processor- or computer-readable and encode and/or contain machine-executable, processor-executable or computer-executable programs and instructions. Program storage devices may include or be digital storage devices, magnetic storage media such as magnetic disks and magnetic tapes, hard disk drives, or optically readable digital data storage media, for example. Other examples may also include computers, processors, control units, (field) programmable logic arrays ((F)PLAs), (field) programmable gate arrays ((F)PGAs), graphics processor units (GPU), application-specific integrated circuits (ASICs), integrated circuits (ICs) or system-on-a-chip (SoCs) systems programmed to execute the steps of the methods described above.

It is further understood that the disclosure of several steps, processes, operations or functions disclosed in the description or claims shall not be construed to imply that these operations are necessarily dependent on the order described, unless explicitly stated in the individual case or necessary for technical reasons. Therefore, the previous description does not limit the execution of several steps or functions to a certain order. Furthermore, in further examples, a single step, function, process, or operation may include and/or be broken up into several sub-steps, -functions, -processes or -operations.

If some aspects have been described in relation to a device or system, these aspects should also be understood as a description of the corresponding method. For example, a block, device or functional aspect of the device or system may correspond to a feature, such as a method step, of the corresponding method. Accordingly, aspects described in relation to a method shall also be understood as a description of a corresponding block, a corresponding element, a property or a functional feature of a corresponding device or a corresponding system.

The following claims are hereby incorporated in the detailed description, wherein each claim may stand on its own as a separate example. It should also be noted that although in the claims a dependent claim refers to a particular combination with one or more other claims, other examples may also include a combination of the dependent claim with the subject matter of any other dependent or independent claim. Such combinations are hereby explicitly proposed, unless it is stated in the individual case that a particular combination is not intended. Furthermore, features of a claim should also be included for any other independent claim, even if that claim is not directly defined as dependent on that other independent claim.

What is claimed is:

1. A time-interleaved analog-to-digital converter, ADC, circuit, comprising:
   an input for an analog input signal;
   a first ADC bank comprising a first plurality of parallel time-multiplexed ADCs, wherein the first plurality of parallel time-multiplexed ADCs is configured to subsequently generate a first plurality of samples of the analog input signal during a first time interval;
   a first buffer amplifier coupled between the input and the first ADC bank;
   a second ADC bank comprising a second plurality of parallel time-multiplexed ADCs, wherein the second plurality of parallel time-multiplexed ADCs is configured to subsequently generate a second plurality of samples of the analog input signal during a second time interval,
      wherein the first and the second time intervals are subsequent time intervals;
   a second buffer amplifier coupled between the input and the second ADC bank;
   wherein
      the first ADC bank has associated therewith at least one first dummy sampler coupled to an output of the first buffer amplifier, wherein the ADC circuit is configured to activate the first dummy sampler before the start of the first time interval, and
      the second ADC bank has associated therewith at least one second dummy sampler coupled to an output of the second buffer amplifier, wherein the ADC circuit is configured to activate the second dummy sampler before the start of the second time interval.

2. The time-interleaved ADC circuit of claim 1, wherein the first dummy sampler is coupled to the first buffer amplifier in parallel to the first plurality of parallel time-multiplexed ADCs, and wherein the second dummy sampler is coupled to the second buffer amplifier in parallel to the second plurality of parallel time-multiplexed ADCs.

3. The time-interleaved ADC circuit of claim 1,
   wherein the first ADC bank comprises a first plurality of parallel time-multiplexed samplers coupled between the first buffer amplifier and the first plurality of parallel time-multiplexed ADCs, wherein the first dummy sampler is coupled to the first buffer amplifier in parallel to the first plurality of parallel time-multiplexed samplers, and
   wherein the second ADC bank comprises a second plurality of parallel time-multiplexed samplers coupled between the second buffer amplifier and the second plurality of parallel time-multiplexed ADCs, wherein the second dummy sampler is coupled to the second buffer amplifier in parallel to the second plurality of parallel time-multiplexed samplers.

4. The time-interleaved ADC circuit of claim 3, further comprising one or more third buffer amplifiers coupled between the first plurality of parallel time-multiplexed samplers and the first plurality of parallel time-multiplexed ADCs, and one or more fourth buffer amplifiers coupled between the second plurality of parallel time-multiplexed samplers and the second plurality of parallel time-multiplexed ADCs.

5. The time-interleaved ADC circuit of claim 1, wherein the ADC circuit comprises a control circuit configured to activate the first dummy sampler at the transition from the second time interval to the first time interval and to activate the second dummy sampler at the transition from the first time interval to the second time interval.

6. The time-interleaved ADC circuit of claim 1, wherein the ADC circuit comprises a control circuit configured to activate the first dummy sampler one clock cycle before a first clock cycle of the first time interval in which a first one of the first plurality of parallel time-multiplexed ADCs is activated and to activate the second dummy sampler one clock cycle before a first clock cycle of the second time interval in which a first one of the second plurality of parallel time-multiplexed ADCs is activated.

7. The time-interleaved ADC circuit of claim 1, wherein the ADC circuit comprises a control circuit configured to activate the first dummy sampler during a last clock cycle of the second time interval in which a last one of the second plurality of parallel time-multiplexed ADCs is activated and to activate the second dummy sampler during a last clock cycle of the first time interval in which a last one of the first plurality of parallel time-multiplexed ADCs is activated.

8. The time-interleaved ADC circuit of claim 1, wherein each of the time-multiplexed ADCs comprises a respective input-sampling circuitry having a respective input switch, a respective capacitor, and a respective digitizer for digitizing a potential of the capacitor.

9. The time-interleaved ADC circuit of claim 1, wherein the ADC circuit is configured to discard samples of the analog input signal generated by the first and the second dummy sampler.

10. The time-interleaved ADC circuit of claim 1, wherein the first dummy sampler is configured to mimic an input impedance of any one of the first plurality of parallel time-multiplexed ADCs within a predefine tolerance range, and wherein the second dummy sampler is configured to mimic an input impedance of any of the second plurality of parallel time-multiplexed ADCs within a predefine tolerance range.

11. The time-interleaved ADC circuit of claim 1, wherein each of the time-multiplexed ADCs comprises an input-sampling circuitry having an input switch and a capacitor, and wherein each of the dummy samplers comprises said input switch and said capacitor within predefined tolerance ranges.

12. The time-interleaved ADC circuit of claim 1, wherein the first dummy sampler comprises the same circuit components as one of the first plurality of parallel time-multiplexed ADCs within a predefine tolerance range, and wherein the second dummy sampler comprises the same circuit components as one of the second plurality of parallel time-multiplexed ADCs within a predefine tolerance range.

13. The time-interleaved ADC circuit of claim 1, wherein the time-interleaved ADC circuit is an integrated CMOS circuit.

14. A base station for wireless communications, the base station comprising
   a time-interleaved ADC circuit, the time-interleaved ADC circuit comprising an input for an analog RF signal;
      a first ADC bank comprising a plurality of first parallel time-multiplexed ADCs, wherein the first parallel time-multiplexed ADCs are configured to subsequently generate respective first samples of the analog RF signal during a first sampling time interval;
a first voltage buffer coupled between the input and the first ADC bank;
a second ADC bank comprising a plurality of second parallel time-multiplexed ADCs,
wherein the second parallel time-multiplexed ADCs are configured to subsequently generate respective second samples of the analog RF signal during a second sampling time interval,
wherein the first and the second sampling time intervals are subsequent time intervals;
a second voltage buffer coupled between the input and the second ADC bank;
wherein
the first ADC bank additionally comprises a first dummy sampler coupled to an output of the first voltage buffer, wherein the time-interleaved ADC circuit is configured to activate the first dummy sampler before the start of the first sampling time interval, and
the second ADC bank additionally comprises a second dummy sampler coupled to an output of the second voltage buffer, wherein the time-interleaved ADC circuit is configured to activate the second dummy sampler before the start of the second sampling time interval.

15. The base station of claim 14, wherein the time-interleaved ADC circuit is configured not to use samples of the analog input signal generated by the first and the second dummy sampler.

16. A time-interleaved analog-to-digital conversion method, the method comprising:
buffering an analog input signal with a first buffer amplifier to generate a first buffered input signal;
subsequently generating, using a first ADC bank having a first plurality of parallel time-multiplexed ADCs coupled to the first buffer amplifier, a first plurality of samples of the first buffered input signal during a first time interval;
buffering the analog input signal with a second buffer amplifier to generate a second buffered input signal;
subsequently generating, using a second ADC bank having a second plurality of parallel time-multiplexed ADCs coupled to the second buffer amplifier, a second plurality of samples of the second buffered input signal during a second time interval;
wherein the first and the second time intervals are subsequent time intervals;
before the start of the first time interval, activating a first dummy sampler associated with the first ADC bank and coupled to an output of the first buffer amplifier, and before the start of the second time interval, activating a second dummy sampler associated with the second ADC bank and coupled to an output of the second buffer amplifier.

17. The method of claim 16, wherein activating the first dummy sampler comprises preloading the first buffer amplifier with a load impedance of any one of the first plurality of parallel time-multiplexed ADCs within a predefine tolerance range, and wherein activating the second dummy sampler comprises preloading the second buffer amplifier with a load impedance of any one of the second plurality of parallel time-multiplexed ADCs within a predefine tolerance range.

18. The method of claim 16, wherein the first and the second dummy sampler are not used for generating samples of the respective buffered input signals.

* * * * *